(12) United States Patent
Jazayeri

(10) Patent No.: US 7,721,041 B2
(45) Date of Patent: May 18, 2010

(54) PSRAM AND METHOD FOR OPERATING THEREOF

(75) Inventor: Reza Jazayeri, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 412 days.

(21) Appl. No.: 11/828,926

(22) Filed: Jul. 26, 2007

(65) Prior Publication Data

US 2009/0027992 A1    Jan. 29, 2009

(51) Int. Cl.
*G06F 12/00*    (2006.01)
*G11C 8/00*    (2006.01)

(52) U.S. Cl. .................................................. 711/104
(58) Field of Classification Search ................. None
See application file for complete search history.

(56) References Cited

U.S. PATENT DOCUMENTS

| | | | |
|---|---|---|---|
| 5,295,109 A * | 3/1994 | Nawaki ....................... 365/222 |
| 7,209,402 B2 * | 4/2007 | Shinozaki et al. ........... 365/222 |
| 7,295,483 B2 * | 11/2007 | Shinozaki et al. ........... 365/222 |
| 7,317,650 B2 * | 1/2008 | Shinozaki et al. ........... 365/222 |
| 2004/0008544 A1 * | 1/2004 | Shinozaki et al. ....... 365/189.05 |
| 2006/0007770 A1 * | 1/2006 | Shinozaki et al. ........... 365/222 |
| 2006/0291297 A1 * | 12/2006 | Shinozaki et al. ....... 365/189.04 |
| 2007/0153613 A1 * | 7/2007 | Shinozaki et al. ........... 365/226 |
| 2009/0161467 A1 * | 6/2009 | Lin et al. ..................... 365/222 |

* cited by examiner

*Primary Examiner*—Kevin Verbrugge
(74) *Attorney, Agent, or Firm*—Grossman, Tucker, Perreault & Pfleger, PLLC

(57) ABSTRACT

Disclosed is a pseudo static random access memory (PSRAM) and a method for operating the same. The PSRAM includes a multi-bit control register and a multiplexer circuit operatively coupled to the multi-bit control register. The multi-bit control register has a first set of bits reserved for a page control mode of the PSRAM and a second set of bits reserved for a bus control mode of the PSRAM. The multiplexer circuit activates one of the page control mode and the bus control mode of the PSRAM based on a logic level of an address bit inputted to the multiplexer circuit.

7 Claims, 4 Drawing Sheets

PSRAM AND METHOD FOR OPERATING THEREOF

FIELD

The present disclosure generally relates to a pseudo static random access memory (PSRAM), and, more particularly, to operating a low density PSRAM, thereby reducing the power consumption of the low density PSRAM.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

Figure 1:
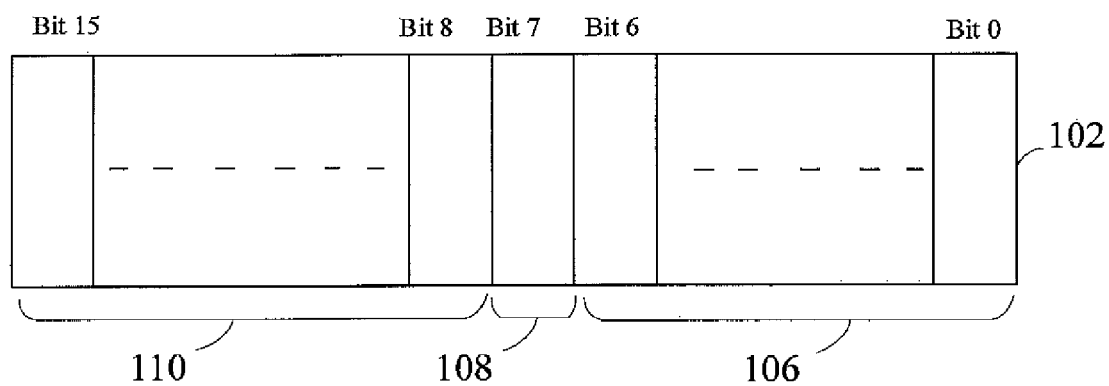
FIG. 1 is a block diagram illustrating a prior art system for operating a PSRAM.
Figure 1:
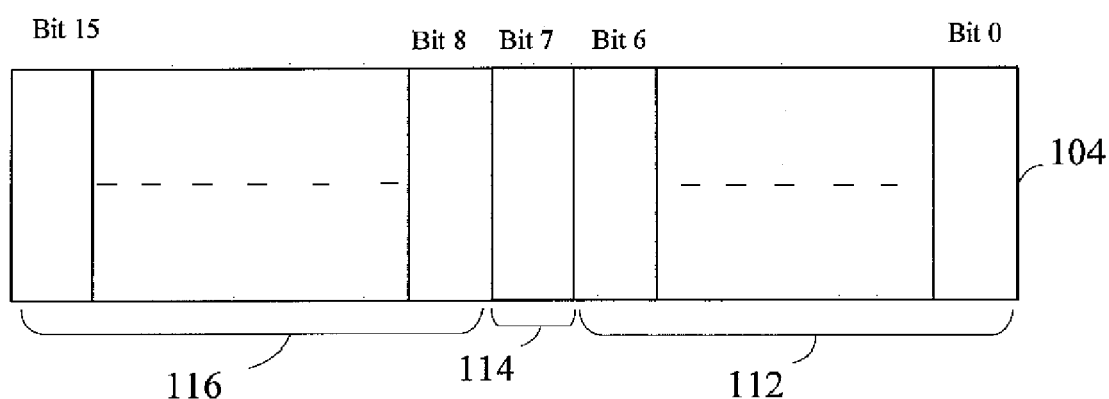

For a thorough understanding of the present disclosure, refer to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item.

The present disclosure provides a low cost and a low density synchronous pseudo static random access memory (PSRAM) and a method for operating the same. The PSRAM eliminates need for a dedicated circuitry to operate the PSRAM in one or more of control modes, thereby simplifying the peripheral circuits required for operating the PSRAM. Moreover, the PSRAM of the present disclosure is "drop-in" compatible with existing PSRAMs. Accordingly, existing system software does not need to be modified, thereby resulting in a simple, fast, and reliable operation of the PSRAM in electronic devices.

PSRAMs are generally used in electronic devices since they have large capacities and can be produced inexpensively. Examples of electronic devices include, but are not limited to, mobile phones, personal computers, laptops, and personal digital assistants (PDAs).

The PSRAMs in the electronic devices serve to memorize information and store the information as a group of charges in a capacitor and share the charges in a corresponding bit line through a transistor. Whenever it is required to read a data, the shared charges are amplified. However, the amount of charges retained by the capacitor is reduced even when a same voltage level of data is written in the capacitor. In order to compensate the decrease in the amount of retained charges, a self-refresh operation is periodically performed by the PSRAMs.

The existing PSRAMs perform various self-refresh control operations. These control operations reduce power consumption under certain conditions, and are hereinafter referred to as 'power saving self refresh control modes', or, interchangeably as 'power saving features'. Suitable examples of power saving self-refresh control modes include a Partial Array Self Refresh (PASR) mode, a Temperature Compensated Self Refresh (TCSR) mode, a Deep Power Down (DPD) mode, and the like.

However, these power saving features do not impact the functionality or interface timings of the PSRAM. Further, these features require a dedicated control register in the PSRAM for their control.

Currently, the synchronous PSRAM design includes two multi-bit control registers. FIG. 1 is a block diagram illustrating such a prior art system for operating a PSRAM. The PSRAM includes two multi-bit control registers, more specifically, a refresh control register 102 and a bus control register 104. For performing a write operation to the refresh control register 102 and the bus control register 104, an address bit is set to a logic level. Based on the logic level of the address bit, one of the refresh control register 102 and the bus control register 104 is selected. For example, when the logic level of the address bit is set to zero, the refresh control register 102 may be selected. Further, when the logic level of the address bit is set to one, the bus control register 104 may be selected.

Activation or deactivation of these power saving features like PASR, TCSR, and DPD requires writing to specific bits of the multi-bit control registers (i.e., the refresh control register 102 and the bus control register 104) of the PSRAM.

The refresh control register 102 includes a plurality of bits. For example, the refresh control register 102 includes a bit 0, a bit 1, a bit 2, a bit 3, a bit 4, a bit 5, and a bit 6, collectively represented as bits 106; a bit 7 represented as a bit 108; and a bit 8, a bit 9, a bit 10, a bit 11, a bit 12, a bit 13, a bit 14, and a bit 15, collectively represented as bits 110. The plurality of bits can be configured to activate one or more modes of the PSRAM, based on a write operation. For example, a write operation to the bits 106 and the bits 110 activates one of the PASR mode, the TCSR mode, the DPD mode and other refresh control modes. Moreover, a write operation performed to the bit 108 activates a page control mode of the PSRAM.

The page control mode enables the PSRAM to perform a read or a write operation effectively. Each page in a PSRAM refers to a group of memory cells. The memory cells shares a same word line but have a different column address for each bit of the word line. When a data is stored or read in the memory cell, both a row path and a column path of the page are not always performed. For example, for performing a read operation on a data stored in the memory cell, the row path is once performed at an initial stage. Thereafter, only the column path is changed by changing a column address while the word line is activated, so that the read operation or the write operation is performed at a high speed.

The bus control register 104 includes a plurality of bits. For example, the bus control register 104 may include a bit 0, a bit 1, a bit 2, a bit 3, a bit 4, a bit 5, and a bit 6, collectively represented as bits 112; a bit 7, represented as a bit 114; and a bit 8, a bit 9, a bit 10, a bit 11, a bit 12, a bit 13, a bit 14, and a bit 15, collectively represented as bits 116. A write operation to one or more bits of the bus control register 104 may activate one or more operations of the PSRAM. For example, a write operation on the bits 112 and the bits 116 activates the bus control mode of the PSRAM. However, the bit 114 is a reserved bit. As used herein, the bus control mode may be used to specify a PSRAM interface configuration, for example, synchronous, asynchronous, burst length, and the like.

To operate the PSRAM in one of the page control mode and the bus control mode, the address bit is set at a logic level. For example, by setting the logic level of the address bit to zero, the refresh control register 102 is selected. Accordingly, the refresh control modes like PASR, TCSR, and DPD may be enabled. Alternatively, by selecting the logic level of the address bit as one, the bus control register 104 of the PSRAM is selected.

However, the above method requires a dedicated register for performing the power saving refresh control modes and other refresh control modes. The need for dedicated control registers, for example, the refresh control register 102 and the bus control register 104, elevates the complexity of the PSRAM, thereby making the PSRAM costlier. However, currently emerging low-cost electronic devices require lower cost and low density synchronous PSRAMs. At lower PSRAM densities, the power saving features enabled by the refresh control register 102 do not provide much benefit. Instead, these features add to the cost of the electronic devices implementing the PSRAMs by increasing a die size, increasing test times, and lowering yields. Eliminating the power saving features results in low cost and low density PSRAMs.

Figure 2:
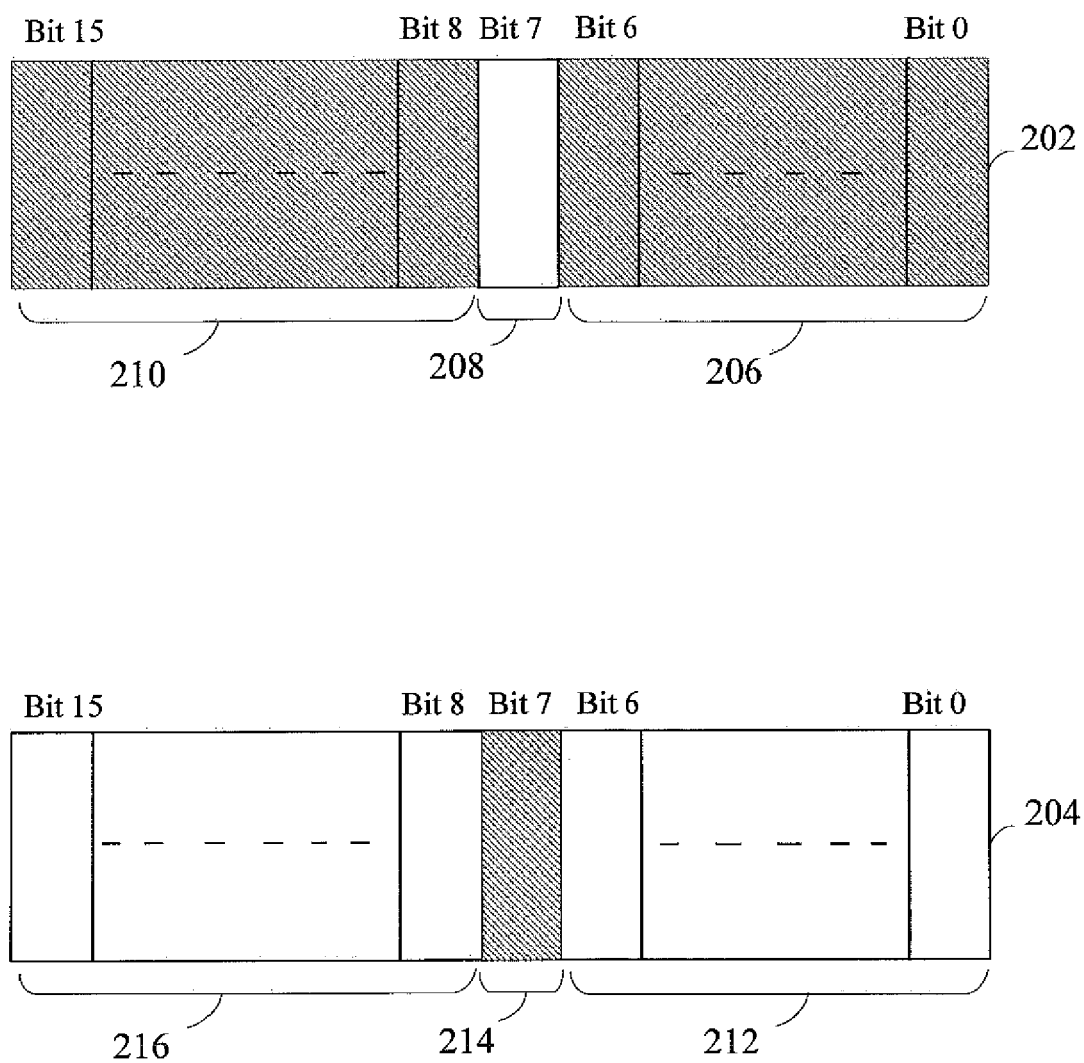
FIG. 2 is a block diagram illustrating another system for operating a PSRAM.

FIG. 2 is a block diagram illustrating another system for operating a PSRAM. The system eliminates the need for power saving features of the PSRAM. FIG. 2 shows resulting registers, more specifically, a refresh control register 202 (without bits reserved for power saving features like PASR, TCSR and DPD) and a bus control register 204. The refresh control register 202 includes a bit 0, a bit 1, a bit 2, a bit 3, a bit 4, a bit 5, and a bit 6, collectively represented as bits 206; a bit 7, represented as a bit 208, and a bit 8, a bit 9, a bit 10, a bit 11, a bit 12, a bit 13, a bit 14, and a bit 15, collectively represented as a bit 210. The refresh control register 202 is similar to the refresh control register 102 (of FIG. 1), with an exception that the controls for the power saving features have been removed from the refresh control register 202. Therefore, the power saving self-refresh control modes of the PSRAM are not activated by the write operation to the bits 206 and the bits 210. However, the write operation to the bit 208 enables the page control mode of the PSRAM.

The bus control register 204 is similar to the bus control register 104 (of FIG. 1). The bus control register 204 includes a plurality of bits. For example, the bus control register 204 may include a bit 0, a bit 1, a bit 2, a bit 3, a bit 4, a bit 5, and a bit 6, collectively represented as bits 212; a bit 7, represented as a bit 214; and a bit 8, a bit 9, a bit 10, a bit 11, a bit 12, a bit 13, a bit 14, and a bit 15, collectively represented as bits 216. A write operation to one or more bits of the bus control register 204 may activate one or more operations of the PSRAM. For example, a write operation to the bits 212 and the bits 216 activates bus control mode of the PSRAM. However, the bit 214 is a reserved bit.

In this design, the bit 7 (i.e., the bit 208) of the refresh control register 202 is the page control mode bit and the bit 7 (i.e., the bit 214) of the bus control register 204 is reserved. Accordingly, the two registers may be combined into a single multi-bit control register, as described herein in conjunction with FIG. 3.

Figure 3:
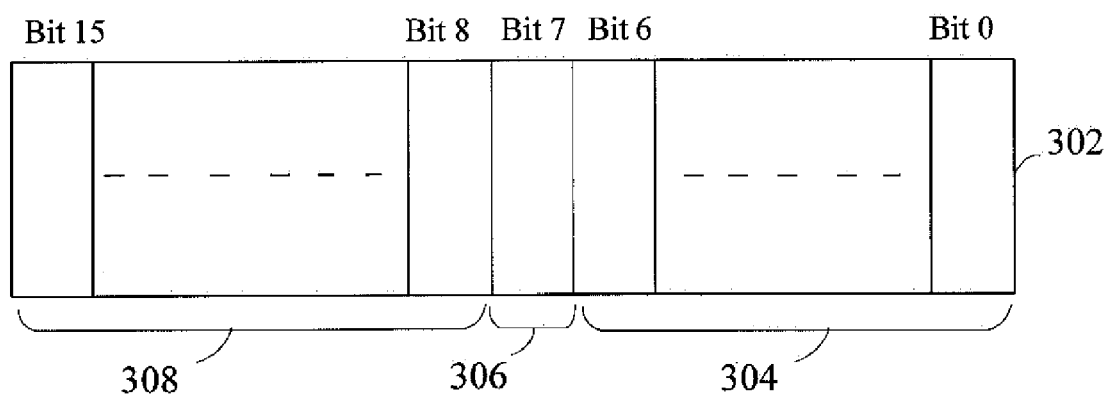
FIG. 3 is a block diagram illustrating a multi-bit control register for operating a PSRAM, according to an exemplary embodiment of the present disclosure.

FIG. 3 is a block diagram illustrating a multi-bit control register 302 for operating the PSRAM, according to an exemplary embodiment of the present disclosure. The multi-bit control register 302 includes a plurality of bits. For example, the multi-bit control register 302 include a bit 0, a bit 1, a bit 2, a bit 3, a bit 4, a bit 5, and a bit 6, collectively represented as bits 304; a bit 7, represented as a bit 306; and a bit 8, a bit 9, a bit 10, a bit 11, a bit 12, a bit 13, a bit 14 and a bit 15, collectively represented as bits 308. The multi-bit control register 302 includes a first set of bits reserved for a page control mode of the PSRAM and a second set of bits reserved for a bus control mode of the PSRAM. For example, the bits 304 and the bits 308 may be reserved for performing a bus control operation of the PSRAM. Further, the bit 306 may be reserved for performing the page control mode operation of the PSRAM.

Figure 4:
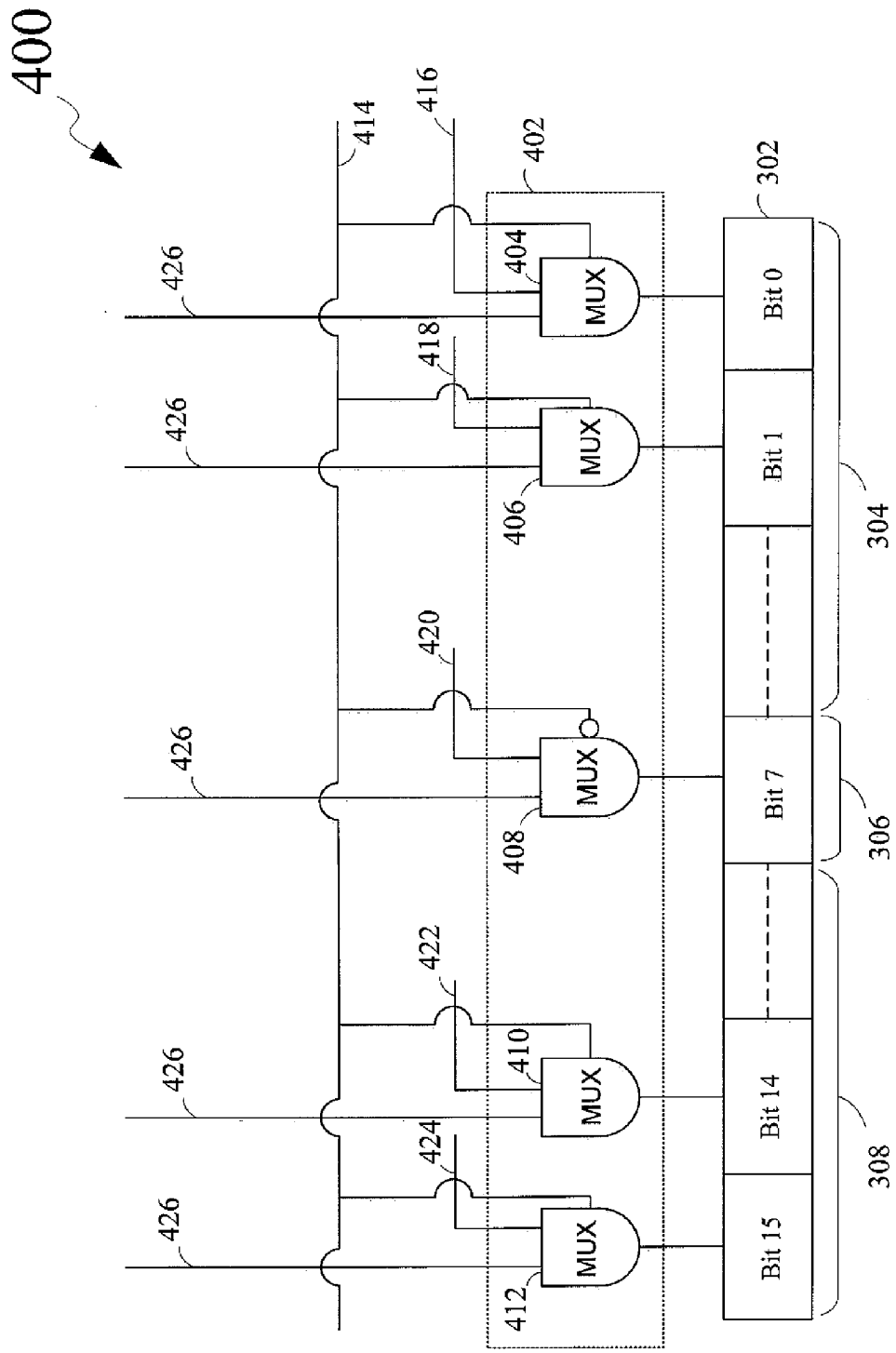
FIG. 4 is a circuit diagram of a PSRAM, according to an exemplary embodiment of the present disclosure.

FIG. 4 is a circuit diagram 400 of a PSRAM, according to an exemplary embodiment of the present disclosure. The circuit diagram includes the multi-bit control register 302 (of FIG. 3), and a multiplexer circuit 402 operatively coupled to the multi-bit control register 302.

As used herein for the PSRAM of the present disclosure, the multiplexer circuit 402 includes a plurality of multiplexers. For the sake of clarity, the multiplexer circuit is shown to include a multiplexer 404, a multiplexer 406, a multiplexer 408, a multiplexer 410, and a multiplexer 412. Each multiplexer of the plurality of multiplexers 404, 406, 408, 410, 412 is operatively coupled to a bit of the multi-bit control register 302. For example, the multiplexer 404 is operatively coupled to the bit 0 of the multi-bit control register 302. Similarly, the multiplexer 406 is operatively coupled to the bit 1 of the multi-bit control register 302. Moreover, the multiplexer 408 is operatively coupled to the bit 7 (represented as the bit 306) of the multi-bit control register 302.

The multiplexer circuit 402 is capable of activating one of the page control mode and the bus control mode of the PSRAM based on a logic level of an address bit inputted to the multiplexer circuit 402. In one embodiment, the multiplexer circuit 402 is operatively coupled to an address line 414. The address line 414 is responsible for inputting the logic level of the address bit to the multiplexer circuit 402. The logic level includes a first logic level and a second logic level.

Further, each multiplexer of the plurality of multiplexers includes a loop back line for looping back existing settings of the multi-bit control register 302 for other bits of the input data. As shown in FIG. 4, the multiplexer 404 includes a loop back line 416, the multiplexer 406 includes a loop back line 418, the multiplexer 408 includes a loop back line 420, the multiplexer 410 includes a loop back line 422, and the multiplexer 412 includes a loop back line 424.

In one embodiment of the present disclosure, when the first logic level is higher than the second logic level, the multiplexer circuit 402 activates the page control mode of the PSRAM at the first logic level and activates the bus control mode of the PSRAM at the second logic level. For example, when the logic level of the address bit is set to one, the multiplexer circuit 402 may pass only a bit 7 of the input data using a data line 426 through the bit 7 (represented by bit 306) of the multi-bit control register 302. Further, the multiplexer circuit 402 may activate existing operations on the remaining bits of the input data i.e. for bit 0 to bit 6 and the bit 8 to bit 15.

When the address bit is set to zero, the multiplexer circuit 402 passes bit 0 to bit 6 and the bits 8 to bit 15 of the input data using the data line 426 through the bits 304 and the bits 308 respectively of the multi-bit control register 302. Such an operation may activate the bus control mode of the multi-bit control register 302. Further, the multiplexer circuit 402 may loop back through the loop back line 420 to an existing control operation for the bit 7 of the input data.

In another embodiment, when the first logic level is lower than the second logic level, the multiplexer circuit 402 activates the page control mode of the PSRAM at the first logic level and activates the bus control mode of the PSRAM at the second logic level. For example, when the address bit is set to zero, the multiplexer circuit 402 passes only a bit 7 of the input data using the data line 426 through the bit 7 (represented by bit 306) of the multi-bit control register 302. Such an operation may activate the page control mode of the PSRAM. Further, the existing settings of the multi-bit control register 302 are looped back for bits 0 to 6 and bits 8 to 15 of the input data. Moreover, when the address bit is set to one, the multiplexer circuit 402 passes the bits 0 to 6 and the bits 8 to 15 of the input data using the data line 426 through the bits 304 and the bits 308 respectively of the multi-bit control register 302. This operation may activate the bus control mode of the multi-bit control register 302. The multiplexer circuit 402 passes all bits of the data with the exception of the bit 7. The existing setting of the multi-bit control register 302 is then just looped back to the register for the bit 7 of the data.

The PSRAM circuit 400, as illustrated in the FIG. 4, is shown to include the multi-bit control register 302, the multiplexer circuit 402, the address line 414, the data line 426 and the loop back lines 416, 418, 420, 422, and 424. However, it should be obvious to a person ordinarily skilled in the art that the PSRAM circuit 400 described in the present disclosure may include more number of components apart from those explained in the present description.

The PSRAM circuit 400 may be implemented in an electronic device, for example, in a personal computer, a laptop, a PDA, and a mobile phone.

The method for operating the PSRAM of the present disclosure may be explained as follows. The method includes reserving a first set of bits of the multi-bit control register 302 for the page control mode of the PSRAM. For example, the bit 306 may be reserved for activating the page control mode of the PSRAM. Further, the method includes reserving a second set of bits of the multi-bit control register 302 for the bus control mode of the PSRAM. For example, the bits 304 and the bits 308 may be reserved for activating the bus control mode of the PSRAM. Moreover, the method includes activating one of the page control mode and the bus control mode of the PSRAM based on a logic level of the address bit. The logic level of the address bit includes a first logic level and a second level.

In an embodiment of the present disclosure, the first logic level is higher than the second logic level. In one embodiment, activating one of the page control mode and the bus control mode of the PSRAM includes activating the page control mode when the logic level of the address bit is set at the first logic level. Further, the method includes activating the bus control mode of the PSRAM when the logic level of the address bit is set at the second logic level. For example, when the address bit is set to a logic level one, the page control mode of the multi-bit control register 302 is activated. Further, when the address bit is set to a logic level zero, the bus control mode of the multi-bit control register 302 is activated.

In another embodiment, the first logic level is lower than the second logic level. The method includes activating the page control mode when the logic level of the address bit is set at the first logic level. Further, the method includes activating the bus control mode when the logic level of the address bit is set at the second logic level. For example, when the address bit is set to a logic level zero, the page control mode of the multi-bit control register 302 is activated. Further, when the address bit is set to a logic level one, the bus control mode of the multi-bit control register 302 is activated.

The present disclosure provides a PSRAM that eliminates need for a dedicated refresh control register, thereby reducing peripheral circuits. Additionally, the present disclosure provides a solution for implementing the proposed system such that it is 'drop-in' compatible with existing semiconductor memories, such as existing PSRAMs and Dynamic Random Access Memories (DRAMs). The system of the present disclosure can be used with already available systems also, without requiring a change in the existing settings. Therefore, the above implementation does not require the system software to be modified. This results in an easier adoption of this system across the multitude of cell phone platforms or chipsets.

As described above, the embodiments of the present disclosure may be in the form of computer-implemented processes and apparatuses for practicing those processes. Embodiments of the present disclosure may also be in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the present disclosure. The present disclosure can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the disclosure. When implemented on a general-purpose microprocessor, the computer program code segments configure the microprocessor to create specific logic circuits.

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A pseudo static random access memory (PSRAM) comprising:
   a multi-bit control register, the multi-bit control register comprising a first set of bits reserved for a page control mode of the PSRAM and a second set of bits reserved for a bus control mode of the PSRAM; and a multiplexer circuit operatively coupled to the multi-bit control register, wherein the multiplexer circuit is capable of activating one of the page control mode and the bus control mode based on a logic level of an address bit inputted to the multiplexer circuit.

2. The PSRAM of claim 1, further comprising an address line operatively coupled to the multiplexer circuit, the address line capable of inputting the logic level of the address bit to the multiplexer.

3. The PSRAM of claim 1, wherein the logic level comprises a first logic level and a second logic level such that the first logic level is higher than the second logic level, and wherein the multiplexer circuit is capable of activating the page control mode of the PSRAM when the logic level of the address bit is set at the first logic level, and wherein the multiplexer circuit is capable of activating the bus control mode of the PSRAM when the logic level of the address bit is set at the second logic level.

4. The PSRAM of claim 1, wherein the logic level comprises a first logic level and a second logic level such that the first logic level is lower than the second logic level, and wherein the multiplexer circuit is capable of activating the page control mode of the PSRAM when the logic level of the address bit is set at the first logic level, and wherein the multiplexer circuit is capable of activating the bus control mode of the PSRAM when the logic level of the address bit is set at the second logic level.

5. A method for operating a pseudo static random access memory (PSRAM), the PSRAM comprising a multi-bit control register, the method comprising:
   reserving a first set of bits of the multi-bit control register for a page control mode of the PSRAM;
   reserving a second set of bits of the multi-bit control register for a bus control mode of the PSRAM; and
   activating one of the page control mode and the bus control mode of the PSRAM based on a logic level of an address bit.

6. The method of claim 5, wherein activating one of the page control mode and the bus control mode of the PSRAM comprises
   activating the page control mode when the logic level of the address bit is set at a first logic level, and
   activating the bus control mode when the logic level of the address bit is set at a second logic level;
   wherein the first logic level is higher than the second logic level.

7. The method of claim 5, activating one of the page control mode and the bus control mode of the PSRAM comprises
   activating the page control mode when the logic level of the address bit is set at a first logic level, and
   activating the bus control mode when the logic level of the address bit is set at a second logic level;
   wherein the first logic level is lower than the second logic level.

* * * * *